United States Patent
Chatrefou et al.

[11] Patent Number: 5,890,096
[45] Date of Patent: Mar. 30, 1999

[54] UNCONVENTIONAL MEASUREMENT TRANSFORMER

[75] Inventors: Denis Chatrefou, Ep Inay Sous; Jean-Francois Mironneau, Massy; Philippe Delbos, Briis Sous Forges, all of France

[73] Assignee: GEC Alsthom T & D Balteau, Montrouge, France

[21] Appl. No.: 743,934

[22] Filed: Nov. 5, 1996

[30] Foreign Application Priority Data

Nov. 6, 1995 [FR] France .................................. 95 13083

[51] Int. Cl.$^6$ ............................ G01R 15/24; H01F 38/34
[52] U.S. Cl. ................................................. 702/64; 702/58
[58] Field of Search .................... 364/480, 481, 364/483, 492, 550; 324/522, 96, 76.82; 307/130, 131; 323/358, 359; 361/1, 35, 79, 86, 87

[56] References Cited

U.S. PATENT DOCUMENTS

| 4,580,234 | 4/1986 | Fujitani | 364/550 |
| 4,999,571 | 3/1991 | Ishiko et al. | 324/96 |
| 5,202,812 | 4/1993 | Shinoda et al. | 361/565 |
| 5,608,327 | 3/1997 | Jones et al. | 324/522 |

FOREIGN PATENT DOCUMENTS

| 0448342A2 | 9/1991 | European Pat. Off. . |
| 0517747A3 | 12/1992 | European Pat. Off. . |
| 2418468 | 9/1979 | France . |
| 4100054A1 | 7/1991 | Germany . |

*Primary Examiner*—Melanie Kemper
*Attorney, Agent, or Firm*—Sughrue, Mion, Zinn, Macpeak & Seas, PLLC

[57] ABSTRACT

The unconventional measurement transformer for protection and/or measurement equipment of a three-phase electricity grid delivers digital information representative of a voltage or of a current of an electricity line by making use of optical sensors that are provided in sufficient number to achieve a certain amount of redundancy in the measurement paths. The output paths of the optical sensors are processed by digital processing means to validate said voltage or current digital information by a majority vote. Advantage is taken of features specific to three-phase high voltage and to the performance of such optical sensors to reduce the number of optical sensors required in an unconventional measurement transformer to obtain a degree of redundancy.

13 Claims, 2 Drawing Sheets

UNCONVENTIONAL MEASUREMENT TRANSFORMER

The invention relates to measurement transformers that perform protection and measurement functions in a high voltage electricity grid (e.g. 100 kV to 800 kV).

BACKGROUND OF THE INVENTION

Unconventional measurement transformers make use of optical sensors. Each optical sensor is a combined system comprising an optical probe (e.g. of the glass ring type) and an optoelectronic circuit card connected to the probe by optical fibers. The optical probe is for placing in the vicinity of the electrical magnitude to be measured (i.e. close to the high voltage primary conductor). It includes a special sensitive medium which presents a slight modification in structure on receiving a magnetic or electric field. A light beam generated by the optoelectronic circuit card is injected into the probe and the reflected light beam serves to measure the electrical magnitude in application of well-known principles of the Faraday effect type for measuring the current carried by an electricity line or of the Pockels effect for measuring the voltage of an electricity line. The optoelectronic circuit card has an output on which it delivers digital data representative of the measured electrical magnitude, after treating the optical signal picked up by the probe. The term "optical current sensor" is used below to designate an optical sensor of the Faraday effect type for measuring the current carried by an electricity line, and the term "optical voltage sensor" is used to designate a Pockels effect type optical sensor for measuring the voltage of an electricity line.

Thus, optical current sensors are known for measuring electric currents with a measurement dynamic range adapted to a protection function (model "BK7" from "SCHOTT") or with a much smaller dynamic range but with measurement accuracy adapted to a measurement function (model "SF57" from "SCHOTT"). Also, patent document FR 93/01991 discloses an optical current sensor of large dynamic range adapted to a protection function and having a glass ring common to two independent outputs (i.e. two optoelectronic circuit cards).

With very high voltage, the way in which a series of advantages (not recalled herein) is obtained makes it seem likely that such unconventional transformers having optical sensors are going to replace so-called "conventional" measurement transformers based on toruses of ferromagnetic material with copper wires wound thereon (serving as a secondary winding) needing to be directly connected to low voltage protection and/or measurement equipment.

Nevertheless, the use of such unconventional measurement transformers raises problems of reliability and availability because of the presence of the optoelectronic circuits which are generally complex and less reliable than mere copper wires.

In particular, the optoelectronic circuit cards of the optical sensors are generally guaranteed for a mean time between failures of five years which is to be compared with thirty years as stated in the specifications for conventional measurement transformers.

To mitigate that drawback, it is therefore necessary to provide a certain amount of optical sensor redundancy, i.e. to provide within an unconventional measurement transformer a plurality of optical sensors for measuring the same electrical magnitude. Redundancy techniques with majority voting are well known. Thus, it is possible to provide an unconventional measurement transformer with three optical sensors for each phase of the electricity line and for each electrical magnitude (current or voltage) to be measured, the sensors having respective outputs connected to data processing means organized to output the data as produced by one of the output paths from the three sensors in application of the majority vote principle. Nevertheless, that configuration turns out to be very expensive in practice. For each electrical magnitude to be measured and for each phase it requires three optical sensors for the protection function plus three optical functions for the measurement function giving a total of six optical sensors.

OBJECT AND SUMMARY OF THE INVENTION

The object of the invention is to propose an unconventional measurement transformer having redundant architecture with a plurality of optical sensors and data processing means operating to deliver the information produced by one of the output paths from the optical sensors in application of the majority vote principle, and which firstly satisfies requirements concerning reliability and availability of measurement information suitable for performing protection and measurement functions, and which secondly is of acceptable cost.

To this end, the invention provides an unconventional measurement transformer for protection and/or measurement equipment of a three-phase electricity grid, the transformer delivering digital information representative of a measured voltage for a certain phase of an electricity line in the electricity grid, said voltage digital information being intended for a protection function or a measurement function of said equipment, wherein it comprises first and second optical voltage sensors, and wherein the outputs of said first and second optical voltage sensors and a combination of respective outputs of two other optical voltage sensors provided respectively for the other two phases of the line are processed by digital processing means to validate said voltage digital information by a majority vote.

With voltage, the dynamic range required for measurement is relatively limited and it is possible to produce said voltage digital information using the same voltage optical sensors for the protection function and for the measurement function. Also, for a three-phase electricity grid that is operating properly, the sum of the three measured voltages of the three electricity line phases is zero, and consequently it is possible to measure the voltage on one phase by summing the voltages measured on the other two phases of the electricity line. The data processing means can therefore be organized to process the combination of the outputs from two other optical voltage sensors in order to validate the output from one or other of said first and second optical voltage sensors in the majority vote. This saves one optical voltage sensor per phase of the electricity line compared with the solution of using massive redundancy as explained above.

The invention also provides an unconventional measurement transformer for protection and/or measurement equipment of a three-phase electricity grid, the transformer delivering digital information representative of a measured current for a certain phase of an electricity line in the electricity grid, said current digital information being intended for a protection function or a measurement function of said equipment, wherein it comprises first and second optical current sensors, each having a measurement dynamic range adapted to a protection function of said equipment, a third optical current sensor having measurement accuracy adapted to a measurement function of said equipment, and wherein the outputs of said first, second, and third optical current sensors are processed by digital processing means to validate said current digital information by a majority vote.

In that configuration, the digital processing means are organized not to forward the output from the third optical current sensor when the digital current information is for use by a protection function since in the event of the high voltage electricity system failing (short circuit), such an optical sensor does not possess sufficient dynamic range to provide a protection function. The output from that optical sensor is therefore made use of by the processing means to validate the output of one or the other of said first and second optical current sensors and it is that validated output which is delivered to the protection function. In contrast, it is the output from the third optical current sensor that serves normally for producing the digital current information when it is intended for a measurement function.

It will thus be understood that an unconventional measurement transformer of the invention for voltage applications only requires only two optical voltage sensors per phase of the electricity line in order to perform protection and/or voltage measuring functions. An unconventional measurement transformer of the invention for measuring current only requires three optical current sensors per phase of the electricity line in order to perform both a protection function and a current measurement function. Also, the two optical current sensors of large measurement dynamic range may advantageously be provided with a glass ring that is common to two output paths as indicated above, thereby further reducing the cost of such a transformer.

The invention also extends to a combination unit for unconventional measurement and having the characteristics specified above.

BRIEF DESCRIPTION OF THE DRAWINGS

Other characteristics and advantages appear more clearly from the following description of an embodiment of the invention.

MORE DETAILED DESCRIPTION

Figure 1:
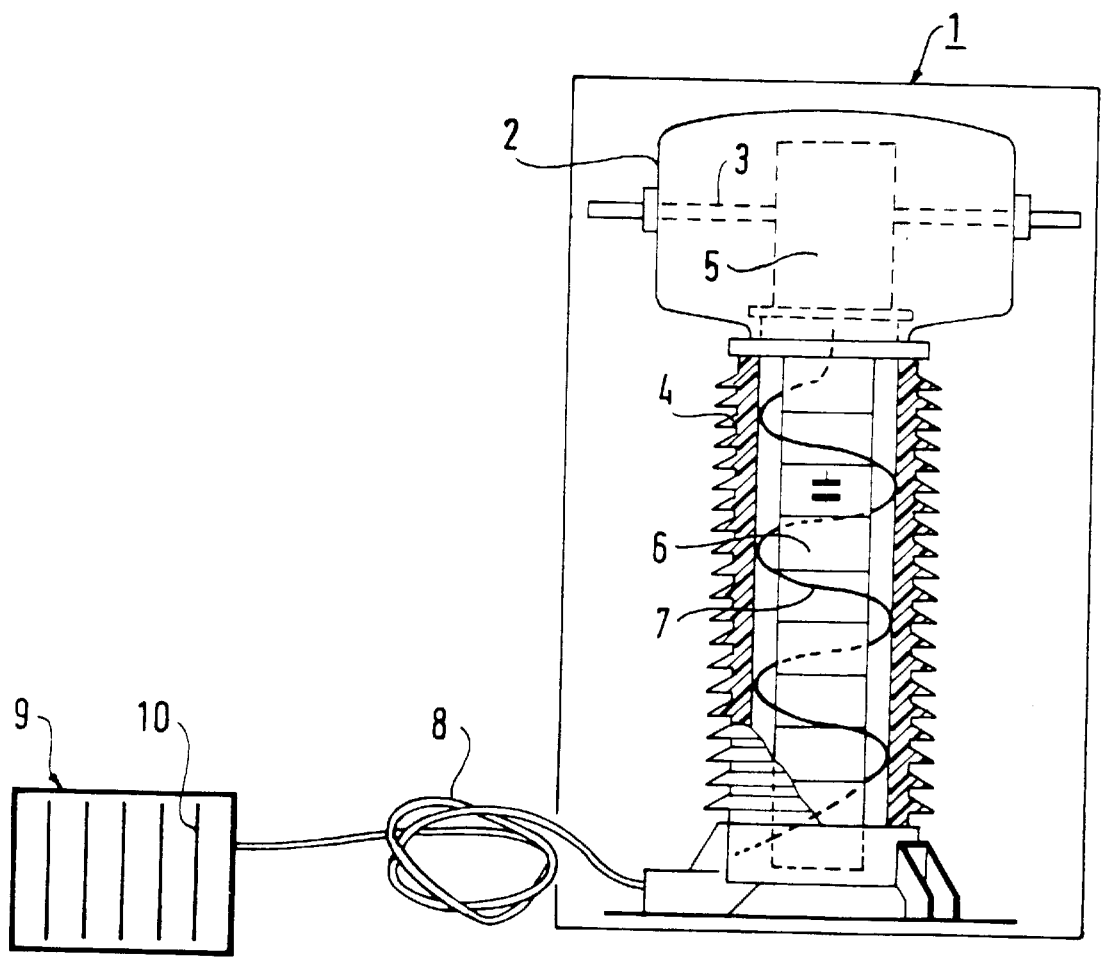
FIG. 1 shows the general appearance of an unconventional measurement transformer for a given phase of an electricity line in a three-phase high voltage electricity grid.

In FIG. 1, an unconventional measurement transformer of the voltage only type, of the current only type, or of the combination type (both voltage and current), comprises a structure 1 (one structure per phase of the three-phase electricity line) including a head 2 housing the optical sensor probes. The head 2 has a metal bar 3 passing therethrough, which bar is associated with one phase of the electricity line on which measurements are performed. The head 2 is insulated from the ground by an electrical insulator constituting a support 4. The probes of the optical sensors are housed in a housing 5 placed inside the head 2 and specially designed to withstand thermal and mechanical shocks. The optoelectronic circuit cards 10 of the optical sensors are placed in a rack 9 located remotely from the structure 1. The optical sensor probes are connected to the optoelectronic cards 10 by means of optical fibers 7, 8. In addition, the support is designed to include a capacitive divider 6 when optical voltage sensors are used.

The optoelectronic circuit cards 10 are designed to control the emission and reception of light signals to and from the probes via the optical fibers 7 and 8, and to output digital information representative of the physical magnitudes to be measured. Each optoelectronic card 10 of an optical sensor is designed to deliver the digital information representative of a current or of a voltage on an output path, e.g. a digital path of the RS232 type or of the 16-bit parallel type, which digital information is used by one or more protection and/or measurement devices that are conventional (not shown).

The architecture of an unconventional measurement transformer of the invention is redundant in order to satisfy the required reliability and availability constraints. More particularly, a plurality of optical sensors are provided to measure each electrical magnitude (current or voltage) of the three-phase electricity line in a high voltage grid. The output paths from the optoelectronic cards of the optical sensors therefore deliver redundant digital information in parallel representative of the measured electrical magnitude.

In accordance with the invention, this digital information is received in parallel by digital processing means suitable for performing majority voting of the 2/3 type. However, there is no point in having massive redundancy for the optical sensors and it is explained below how the number of sensors in an unconventional measurement transformer can be reduced by taking advantage firstly of features specific to three-phase high voltage electricity and secondly of the inherent performance of optical sensors.

Figure 2:
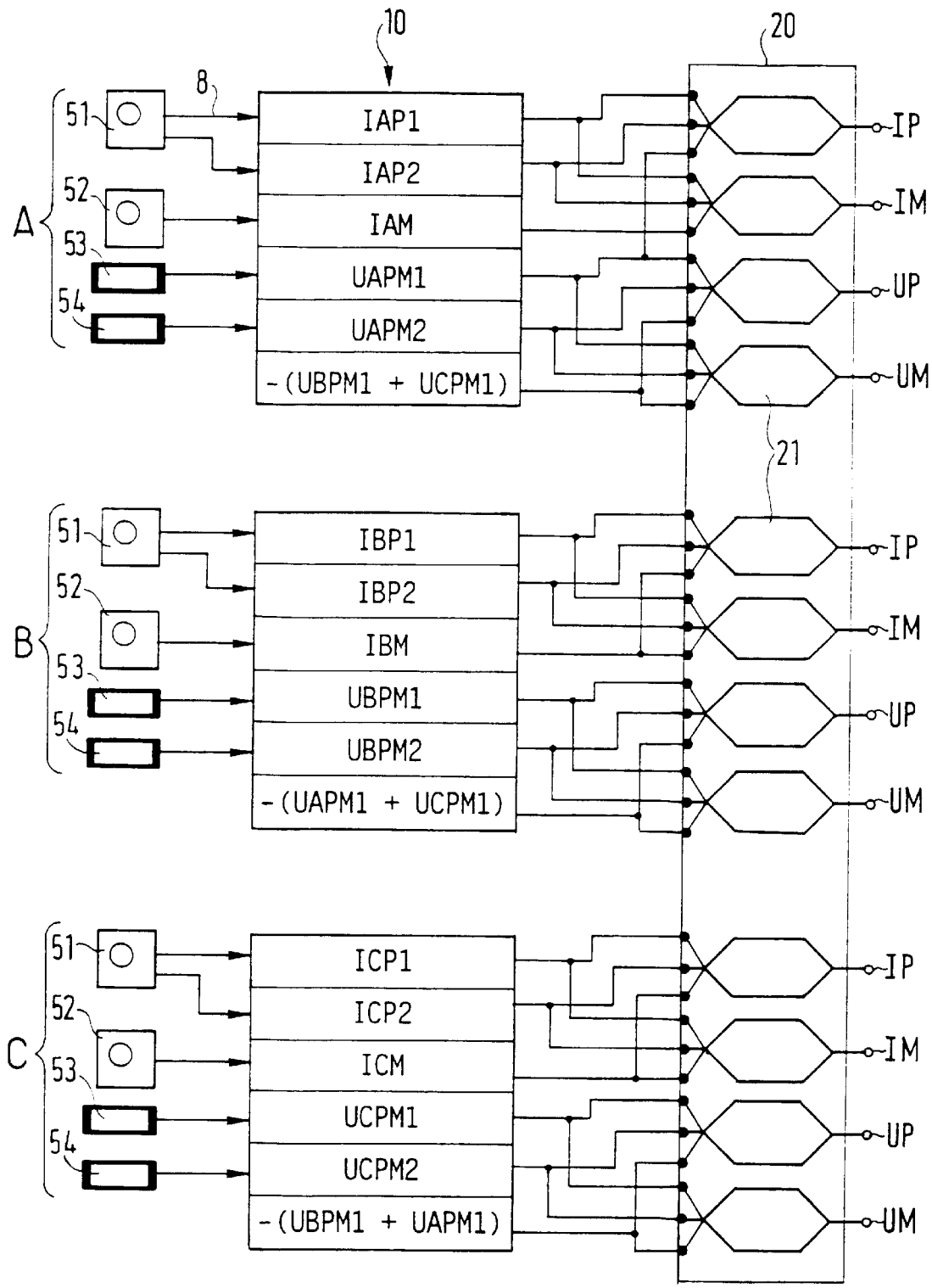
FIG. 2 is a diagram showing the redundant architecture of an unconventional measurement combination unit of the invention.

FIG. 2 shows the redundant architecture of an unconventional measurement transformer of the invention. In this case, a combination type transformer suitable for delivering for each phase of a three-phase electricity line, both digital information IP and IM representative of the magnitude of the current, and digital information UP and UM representative of the voltage.

It should be observed that the information IP and UP is intended more particularly for a protection function whereas the information IM and UM is intended more particularly for a measurement or power metering function.

The structure of the unconventional transformer of the invention is described below for one phase of the line such as phase A, it being understood that the structure is analogous for the other two phases B and C.

To deliver digital information IP (phase A) representative of current, the transformer comprises two optical current sensors preferably sharing a common probe 51 and two optoelectronic cards whose respective output paths are symbolized by IAP1 and IAP2. These two optical current sensors have large measurement dynamic range suitable for performing a protection function. The transformer also includes an optical current sensor of high accuracy (but whose measurement dynamic range is about one-fifth that of the two preceding sensors) with a probe referenced 52 and an optoelectronic card whose output path is symbolized by IAM and which is more particularly adapted to a measurement function. The output paths IAP1, IAP2, and IAM from the optical current sensors are processed by digital processing means 20 which deliver output digital information IP based on slightly degraded majority voting. More particularly, the digital information IP corresponds to one of the output paths IAP1 and IAP2 (each of which possess a dynamic range that is sufficient to cover short circuits), with the path IAM serving in this case to validate, where appropriate, the selected one of the two paths IAP1 and IAP2.

The digital information IM (for phase A) that is intended for a measurement function is produced from the same output paths IAP1, IAP2, and IAM. However, the digital processing means 20 are organized to give precedence to the output path IAM (which is more accurate for measurement purposes). In other words, the digital information IM corresponds to the output path IAM unless there is a fault in said path, and the output paths IAP1 and IAP2 serve to validate output path IAM. In the event of a fault in output path IAM, one of the paths IAP1 and IAP2 is advantageously used to provide the information IM while waiting for the faulty optoelectronic card (IAM) to be replaced.

To provide the digital information UP (phase A) representative of a voltage, the transformer comprises two optical voltage sensors with probes 53 and 54 and optoelectronic cards whose respective output paths are symbolized by UAPM1 and UAPM2. The output paths UAMP1 and UAMP2, and a combination of the output paths UBPM1 and UCPM1 of two other optical voltage sensors provided respectively for the other two phases of the line (phase B, phase C) are processed by the digital processing means 20 to derive the voltage digital information UP by a slightly degraded majority vote. More particularly, the digital information UP corresponds to one of the output paths UAPM1 and UAPM2, with the combination of the other two output paths (−(UBPM1+UCPM1)) serving solely to validate one of the paths UAPM1 and UAPM2, given that it is less accurate than either of the paths UAPM1 and UAPM2.

The digital information UM (phase A) is derived in the same manner as the digital information UP and using the same sensors. In other words, it corresponds to one of the output paths UAPM1 and UAPM2, with the combination of output paths (−(UBPM1+UCPM1)) likewise serving to validate one of said two output paths UAPM1 and UAPM2.

Thus, the architecture of a combination type unconventional measurement transformer of the invention makes use of only five optical sensors per phase, two of which sensors can share a common probe, thereby contributing considerably to reducing the cost of such a measurement transformer, while satisfying constraints on measurement reliability and availability.

In practice, the electronic card of each optical sensor delivers samples on its output path at a rate of 20 kHz such that the digital processing means 20 have about 50 microseconds of time available for performing the majority voting on three inputs. These digital processing means 20 are preferably constituted by a plurality of microcontrollers 21, e.g. the 80C166 circuit from SIEMENS, with each microcontroller 21 being allocated to one output IM, IP, UM, UP for a given electricity phase, as can be seen in FIG. 2.

It should be observed that the majority voting technique makes it possible to ensure continuity of service for the protection and/or measurement functions in the event of one of the optoelectronic cards of the optical sensors failing. Also, each microcontroller is programmed to perform three digital information acquisition programs on three respective input paths, plus one decision program. Each program is given a performance priority level, with the decision program having the lowest priority level. The highest priority level is given to the acquisition program corresponding to one of the sensors whose output path normally serves for providing the measurement digital information output by the microcontroller. The role of the decision program is thus to compare the information acquired by the various acquisition programs and to authorize the acquisition program having the highest priority level to forward the information it has acquired to a serialization member corresponding to the output from the microcontroller. In this manner, the time interval between digital information samples on the input paths of the microcontroller is preserved on the output path thereof. Also, the optoelectronic card of each optical sensor is provided with operating error detection logic in constant communication with the microcontroller to which it is connected to deal with the case where the high voltage electricity network under surveillance is faulty (short circuit) at the same time as an optical sensor is faulty.

Because an unconventional measurement transformer of the invention delivers information in digital form, it can be connected to protection and/or measurement equipment via a direct wire link for nearby connection or via optical fibers for remote connection where isolation constraints apply. Also, conventional protection and/or measurement equipment is low voltage equipment having inputs receiving power signals which are transformed via secondaries into digital signals. Under such circumstances, instead of providing an interface between an unconventional measurement transformer of the invention and such low voltage equipment by recreating power signals from the digital outputs of the transformer, it is more advantageous to connect the outputs of such an unconventional transformer directly to transformer secondary level in the low voltage protection and/or measurement equipment.

We claim:

1. A transformer for protection and measurement equipment of a three-phase electrical grid, the transformer delivering digital information representative of a measured voltage for any one of a first, a second and a third phases in the electrical grid, comprising a first and a second optical voltage sensor provided for said first phase;

a third optical voltage sensor provided for said second phase; and a fourth optical voltage sensor provided for said third phase, wherein the sum of outputs of said third and fourth optical voltage sensors is processed with outputs from said first and second optical voltage sensors in order to validate said digital information by a majority vote.

2. A transformer for protection and measurement equipment of a three-phase electrical grid, the transformer delivering digital information representative of a measured current for any one of a first, a second and a third phases in the electrical grid, said digital information being intended for a protection function or a measurement function of said equipment, comprising:

a first and a second optical current sensor, each having a measurement dynamic range adapted to the protection function of said equipment; and a third optical current sensor having measurement accuracy adapted to the measurement function of said equipment, wherein outputs of said first, second, and third optical current sensors are in order to validate said digital information by a majority vote.

3. The transformer of claim 2, wherein said first and second optical current sensors are designed with a common probe.

4. A combination unit for protection and measurement equipment of a three-phase electrical system, the unit delivering digital information representative of a measured current and a measured voltage for any one of a first, a second and a third phases in the electricity system, said digital information being intended for a protection function or a measurement function of said equipment, comprising a first and a second optical voltage sensor provided for said first phase;

a third optical voltage sensor provided for said second phase;

a fourth optical voltage sensor provided for said third phase;

a first and a second optical current sensors, each having a measurement dynamic range adapted to the protection function of said equipment; and a third optical current sensor having measurement accuracy adapted to the measurement function of said equipment, wherein the sum of outputs of said third and fourth optical voltage sensors is processed with outputs from said first and second optical voltage sensors in order to validate said digital information, representative of said measured voltage, by a majority vote, and the outputs of said first, second and third optical current sensors are processed in order to validate said digital information, representative of said measured current, by the majority vote.

5. The transformer of claim 1, comprising two optical voltage sensors provided for each of said second and third phases.

6. The transformer of claim 2, wherein said first and second optical current sensors are designed with a common probe.

7. The transformer of claim 2, wherein an output of said third optical current sensor is given precedence for use for said measurement function.

8. The transformer of claim 2, comprising three optical current sensors provided for each of said first, second, and third phases in order to perform both the protection function and the current measurement function.

9. The transformer of claim 4, comprising two optical voltage sensors provided for each of said second and third phases.

10. The transformer of claim 4, wherein said first and second optical current sensors are designed with a common probe.

11. The transformer of claim 4, wherein an output of said third optical current sensor is given precedence for use for said measurement function.

12. The transformer of claim 4, comprising three optical current sensors provided for each of said first, second, and third phases in order to perform both the protection function and the current measurement function.

13. The transformer of claim 4, comprising:

two optical voltage sensors provided for each of said second and third phases; and three optical current sensors provided for each of said first, second, and third phases in order to perform both the protection function and the current measurement function.

* * * * *